US005559480A

United States Patent [19]

Ivanivsky

[11] Patent Number: 5,559,480

[45] Date of Patent: Sep. 24, 1996

[54] STRIPLINE-TO-WAVEGUIDE TRANSITION

[75] Inventor: Andrew Ivanivsky, Ridgecrest, Calif.

[73] Assignee: The United States of America as represented by the Secretary of the Navy, Washington, D.C.

[21] Appl. No.: 526,746

[22] Filed: Aug. 22, 1983

[51] Int. Cl.[6] ................................ H01P 1/16; H03H 5/00

[52] U.S. Cl. ............................................ 333/21 R; 333/26

[58] Field of Search ...................................... 333/21 R, 26

[56] References Cited

U.S. PATENT DOCUMENTS

| | | | |
|---|---|---|---|
| 3,265,995 | 8/1966 | Hamasaki | 333/31 |
| 3,483,489 | 12/1969 | Dietrich | 333/21 |
| 3,518,579 | 6/1970 | Hoffman | 333/21 R |
| 3,579,149 | 5/1971 | Ramsey | 333/11 |
| 3,732,508 | 5/1973 | Ito et al. | 333/21 R |
| 3,758,886 | 9/1973 | Landry et al. | 333/21 R X |
| 3,882,396 | 5/1975 | Schneider | 333/21 R X |
| 3,932,823 | 1/1976 | Lavedan, Jr. et al. | 333/21 R |
| 3,969,691 | 7/1976 | Saul | 333/21 R |
| 4,052,683 | 10/1977 | van Heuven et al. | 333/21 R |
| 4,260,964 | 4/1981 | Saul | 533/26 |
| 4,291,278 | 9/1981 | Quine | 330/286 |
| 4,361,820 | 11/1982 | Sagawa et al. | 333/21 R X |

*Primary Examiner*—Gregory C. Issing
*Attorney, Agent, or Firm*—Melvin J. Sliwka; John Forrest

[57] ABSTRACT

A stripline to waveguide transition device efficiently and simply converts the TEM stripline mode to the $TE_{10}$ rectangular waveguide mode. A stripline is inserted longitudinally, end-to-end, into a waveguide. A conductive strip extends from the conductive strip of the stripline into the waveguide passing between two metallic plates, which separate the waveguide from the stripline terminal end and establish a $TE_{10}$ boundary condition. The conductive strip is orthogonally coupled at its distal end to a broad interior wall of the waveguide to provide a transition area supporting both TEM and $TE_{10}$ modes.

6 Claims, 1 Drawing Sheet

STRIPLINE-TO-WAVEGUIDE TRANSITION

BACKGROUND OF THE INVENTION

1. Field of the Invention

This invention relates broadly to the field of electromagnetic energy transmission devices. More particularly, the invention relates to radio frequency transducers or couplers. More specifically, the invention discloses a stripline to waveguide transition device, adapted for coupling microwave electromagnetic energy traveling through a stripline into the air cavity of a waveguide under specific boundary conditions within the waveguide.

2. Description of the Prior Art

Mixed microwave circuits, in which part of the circuit is in the form of conductively bounded hollow circular or rectangular guides (waveguides) and part is in the form of a conductor strip sandwiched by parallel dielectric slabs (stripline) are becoming increasingly popular with the development of microwave integrated circuit techniques. In such circuits, it is generally necessary to transition one or more times between transmission lines of these different types.

Printed circuit and thin film technology have made possible microwave integrated circuits in which many microwave functions are integrated into a single package using stripline as the sole transmission media throughout the package. However, some components are not susceptible to direct stripline connection and must be connected to hollow waveguides. A system which includes such components must therefore provide interconnections between stripline and waveguide transmission components. In many instances, it is convenient to join the waveguide and stripline in an end-to-end fashion especially where the system includes components which tend to be interconnected end-to-end. Such an end-to-end, coplanar, stripline-to-waveguide interconnection avoids structural fabrication problems and electrical energy losses encountered in orthogonal mating of such components as was customary in the prior art.

Coplaner structural interconnection of stripline and waveguide is relatively simple to achieve, but electrical coupling thereof presents difficulties. Typically, a transition must be provided between the principal TEM (Transverse Electro Magnetic) mode of the stripline and the dominant $TE_{10}$ (Transverse Electric, one-zero) mode of a rectangular waveguide. As is well known in the art, such a transition may be accomplished by means of a probe inserted through the broad wall of the waveguide parallel to the electric field, i.e. perpendicular to the broad wall. Transition may also be accomplished by means of a loop inserted in a coplaner fashion in the end of a waveguide. The plane of the loop is normal to the magnetic field of the waveguide, and the loop is shorted to the wall of the guide. The former method utilizes electric field coupling, and is referred to as a top launch transition. The latter employs magnetic field coupling, and is referred to as an end launch transition. A top launch necessitates the perpendicular orientation of the TEM and $TE_{10}$, stripline and waveguide, transmission lines and is not as convenient for use with microwave integrated circuitry as is end-to-end coupling.

Though stripline and rectangular waveguide possess structural similarities, they are physically distinct and hence possess different characteristic impedances. A means is therefore needed to provide a good impedance match for the end launch TEM to $TE_{10}$ transition. Transducers now being used in the art for this purpose employ well-known impedance matching techniques such as dielectric matching, transition through an intermediary coaxial section, or tapering members in the transition region.

It is further necessary that the junction boundary conditions for electric and magnetic field be satisfied at the point where the stripline ends and the waveguide begins.

The invention disclosed herein provides a simple, effective and convenient means for providing a good impedance match between a stripline and a waveguide not disclosed in the prior art, while at the same time establishing requisite boundary conditions for a wave traveling down the waveguide.

SUMMARY OF THE INVENTION

The stripline to waveguide transition device describes a stripline inserted longitudinally into a hollow waveguide in an end-to-end relationship for coupling the TEM mode of the stripline to the dominant $TE_{10}$ mode of the rectangular waveguide. A conductive strip extends from the stripline into the waveguide and is centrally coupled to a broad wall of the waveguide by a post mounted perpendicular to both the strip and the wall. A metallic plate is mounted across the stripline terminal end, interior to the waveguide, and on each side of the conductive strip to establish a reflective barrier for defining boundary conditions for a wave traveling through the waveguide.

OBJECTS OF THE INVENTION

It is an object of the invention to provide a coupler for colinear transmission lines of diverse types.

Another object of the invention is to provide a longitudinal, end-to-end stripline to hollow rectangular waveguide transducer coupling device.

Another object of the invention is to provide a means for efficiently converting the TEM mode of a stripline to the dominant $TE_{10}$ mode of a hollow rectangular waveguide.

A further object is to disclose a novel stripline to waveguide transition device that is extremely simple in construction and inexpensive to manufacture.

Yet another object of the invention is to provide an end to end, in line, stripline to waveguide, transition device having means for defining specific boundary conditions for a wave traveling down the waveguide.

The above mentioned and other objects and features of the disclosed invention will become more readily apparent by reference to the following description in view of the attached drawing and claims.

DESCRIPTION OF THE PREFERRED EMBODIMENT

Figure 1:
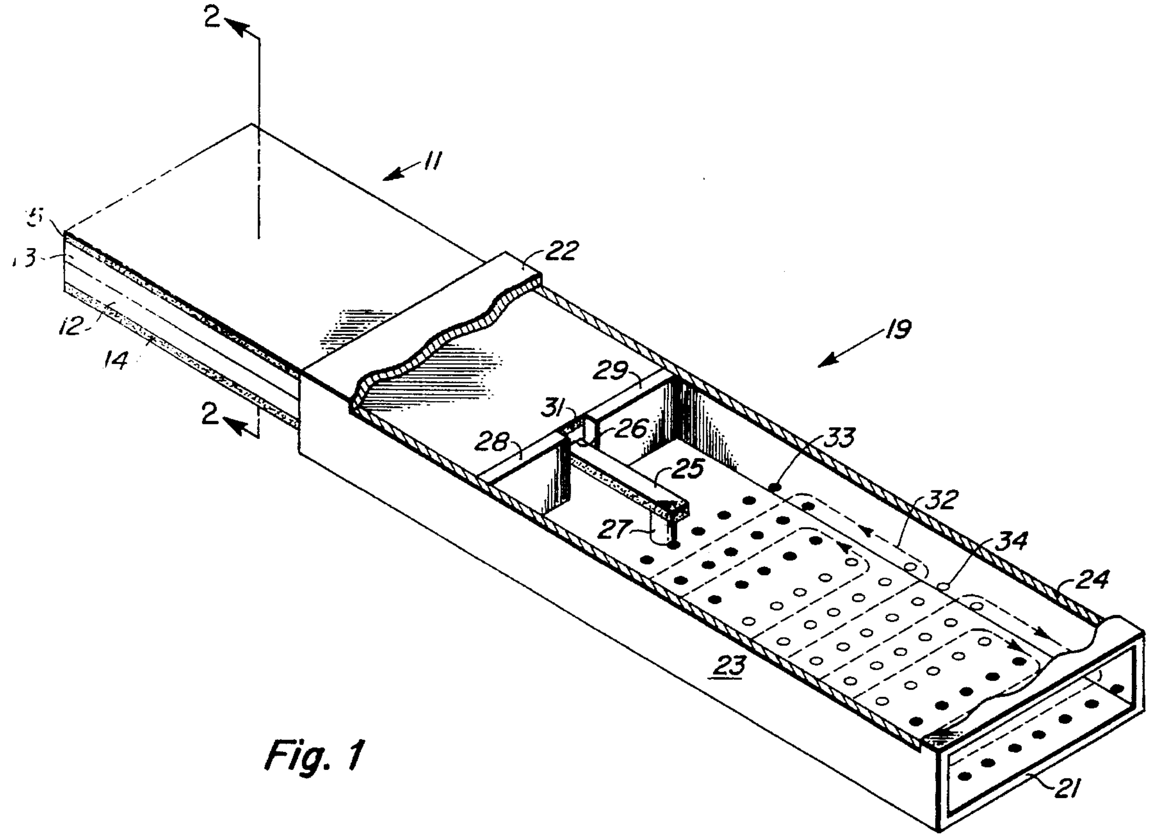
FIG. 1 is an orthogonal cutaway view disclosing the stripline to waveguide transition device described in the following description.

Referring to FIG. 1, an illustrative embodiment of an end launch transition between a rectangular conductively bounded waveguide and a parallel conductor stripline is shown.

A stripline 11 is conventionally composed of a layer of double clad dielectric, a first dielectric layer 12, superimposed with a single clad dielectric, a second dielectric layer 13. Stripline 11 is thereby provided with a one ounce copper, one mil thickness, first ground plane 14, second ground plane 15, and a stripline conductive strip 16, shown in FIG. 2, centrally positioned between first and second dielectric layers 12 and 13.

Figure 2:
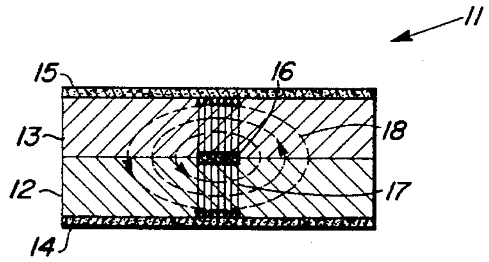
FIG. 2 is a cross section of the stripline.

A cross section 2—2 shown in FIG. 2 more clearly indicates stripline conductive strip 16 and further the confined electric field ($\vec{E}$) indicated by lines 17 and magnetic field ($\vec{H}$) illustrated by dotted lines 18 associated therewith through first and second dielectrics 12 and 13 having a dielectric constant, $\epsilon/\epsilon_o$, of 2.32 in the present embodiment.

Referring again to FIG. 1, stripline 11 is snugly positioned within one end of a rectangular waveguide 19. The channel of waveguide 19 is defined by a broad lower wall 21, an upper wall 22, parallel thereto, and a pair of side walls 23 and 24, parallel to each other. Waveguide 19 can be connected to additional waveguide lengths, not shown, by any of a variety of means conventional to the art. Internal dimensions of one embodiment of waveguide 19 may be for example 1.00 in by 0.20 in.

A conductive strip extension 25 is bonded to the terminal end 26 of stripline conductive strip 16 and is of the same dimension, 0.130 in by 0.010 in, as stripline conductive strip 16. In one embodiment conductive strip extension 25 extends 0.80 in into waveguide 19 from stripline conductive strip terminal end 26 in a manner such that conductive strip extension 25 is centrally positioned within waveguide 19, parallel to upper and lower walls 22 and 21, and terminates on a conductive ground post 27 that couples, in an orthogonal manner, conductive strip extension 25 to lower wall 21 of waveguide 19.

A pair of metallic plates 28 and 29 are bonded to the end 31 of stripline 11 within waveguide 19 at a spaced interval of at least 0.050 in from either side of conductive strip extension 25 to prevent capactive coupling therebetween. Metallic plates 28 and 29 couple ground planes 14 and 15 to waveguide walls 21, 22, 23 and 24, and establish a reflective barrier to provide for a boundary condition for $TE_{10}$ mode waves established in waveguide 19. Metallic plates 28 and 29 effectively terminate waveguide 19 at the end of stripline 11, and thereby separate the stripline circuit from the waveguide circuit.

The transition region between the TEM mode of stripline 11 and the $TE_{10}$ mode of waveguide 19 comprises essentially conductive strip extension 25, ground post 27, and metallic plates 28 and 29. A short formed by ground post 27 couples the TEM mode currents into a magnetic field surrounding ground post 27 in the plane of the magnetic field of the $TE_{10}$ mode of waveguide 19.

A typical $TE_{10}$ mode transitioned from the TEM mode of FIG. 2 is illustrated in FIG. 1 wherein closed loop dotted lines 32 indicate the magnetic field ($\vec{H}$), dots 33 indicate the electric , field ($\vec{E}$) coming out of the page, and the circles 34 indicate the electric field ($\vec{E}$) going into the page.

In order to make the field patterns of the TEM mode, illustrated in FIG. 2, and the $TE_{10}$ mode, illustrated in FIG. 1, coextensive in the transition region, the length of conductive strip extension 25, and to afford a smooth transfer of energy between these modes in consideration of the substantial impedance matching problems associated with the confined field in stripline 11 versus the expanded field associated with waveguide 19, it is necessary that the waveguide channel extend evenly throughout the transition region to support the $TE_{10}$ mode. Furthermore, it is necessary that ground planes 14 and 15 of stripline 11 be coupled through metallic plates 28 and 29 to waveguide walls 21, 22, 23, and 24 to provide TEM propagation concomitantly with $TE_{10}$ propagation throughout the transition region. Necessary carrier boundary conditions for the $TE_{10}$ mode waves in the transition region are also provided for by metallic plates 28 and 29.

It is believed that the best impedance match will be obtained in the invention with the dimensions as above described. When constructed as described, two transitions, located at opposite ends of a short waveguide yield a VSWR (Voltage Standing Wave Ratio) of 1.5:1 and an insertion loss of 1.00 dB (decibels) over a 35% frequency bandwidth.

Variations in the construction of the invention are possible with respect to specific means of fabricating the critical elements. For example conductive strip extension 25, and ground post 27 may be made of brass or equivalent conductive material and metallic plates 28 and 29 can be commercially available aluminum foil.

Nevertheless, although the invention has been described in detail with particular reference to a preferred embodiment thereof, it is to be understood that variations and modifications can be effected within the scope of the invention as further defined by the following claims.

What is claimed is:

1. A coplanar stripline-to-waveguide transition device, comprising;

a stripline having a terminal end;

a rectangular waveguide having two broad and two narrow inner walls and having a receiving end coupled to said stripline terminal end, said stripline terminal end fitting snugly within said rectangular waveguide receiving end;

a conductive strip extension coplanar with and extending from said stripline into said rectangular waveguide, said conductive strip having a remote end centrally positioned within said rectangular waveguide;

a conductive ground post orthogonally connecting said conductive strip extension remote end to one of said rectangular waveguide broad inner walls; and a pair of conductive stripline termination plates mounted on said stripline terminal end on each side of said conductive strip extension coupling one of said rectangular waveguide broad inner walls with the opposite broad inner wall.

2. A stripline-to-waveguide transition device, comprising:

a waveguide having a longitudinal end;

a stripline extending into said longitudinal end of said waveguide;

means coupled between said stripline and said waveguide for exciting an electromagnetic field in said waveguide from a TEM (Transverse Electro Magnetic) mode of said stripline to a $TE_{10}$ (Transverse Electric) mode of said waveguide; and means coupled between said stripline and said waveguide for providing a boundary condition for electromagnetic resonance within said waveguide.

3. A stripline-to-waveguide transition device according to claim 2, wherein said stripline is coplaner with said waveguide.

4. A stripline-to-waveguide transition device according to claim 2, wherein said waveguide is a rectangular waveguide.

5. A stripline-to-waveguide transition device according to claim 2, wherein said exciting means comprises:

a longitudinal conductive strip extension of said stripline and;

a conductive ground post orthogonally coupling said conductive strip extension to said waveguide.

6. A stripline-to-waveguide transition device according to claim 2, wherein said boundary condition means comprises two conducting metal plates positioned at the end of said stripline on each side of said exciting means within said waveguide.

* * * * *